United States Patent [19]

Kohdaka

[11] Patent Number: 5,329,172
[45] Date of Patent: Jul. 12, 1994

[54] CHOPPING TYPE COMPARATOR WITH CLOCKED INVERTER

[75] Inventor: Takayuki Kohdaka, Hamamatsu, Japan

[73] Assignee: Yamaha Corporation, Hamamatsu, Japan

[21] Appl. No.: 972,588

[22] Filed: Nov. 6, 1992

[30] Foreign Application Priority Data

Nov. 8, 1991 [JP] Japan .................... 3-293434

[51] Int. Cl.⁵ .............................................. H03K 5/24
[52] U.S. Cl. ................................. 307/355; 307/491; 307/448
[58] Field of Search ............... 307/352, 353, 355, 357, 307/488, 498, 448, 350, 362, 491; 377/79, 104, 105, 61, 57, 79, 78, 121, 80

[56] References Cited

U.S. PATENT DOCUMENTS

| | | | |
|---|---|---|---|
| 3,737,673 | 6/1973 | Suzuki | 377/79 |
| 4,114,052 | 9/1978 | Manabe et al. | 377/121 |
| 4,197,472 | 4/1980 | Aoki et al. | 307/355 |
| 4,211,942 | 7/1980 | Aoki et al. | 307/355 |
| 4,560,890 | 12/1985 | Masuda et al. | 307/355 |
| 4,568,842 | 2/1986 | Koike | 377/121 |
| 4,656,429 | 4/1987 | Masuda et al. | 307/352 |
| 4,679,214 | 7/1987 | Takemae | 377/80 |
| 4,695,748 | 9/1987 | Kumamoto | 307/352 |
| 5,036,223 | 7/1991 | Sakai | 307/448 |

*Primary Examiner*—Timothy P. Callahan
*Assistant Examiner*—My-Trang Nu Ton
*Attorney, Agent, or Firm*—Spensley Horn Jubas & Lubitz

[57] ABSTRACT

The chopping type comparator is provided with a capacitor which receives at its one end two input signals to be compared with each other through first and second analog switches alternately switchable between a conductive state and a nonconductive state. A clocked inverter is connected at its input terminal to another end of the capacitor. The clocked inverter is changed to an inactive state when one of the first and second analog switches is made conductive. A third analog switch is coupled between the input and output terminals of the clocked inverter. The third analog switch is made conductive concurrently when said one of the first and second analog switches is made conductive.

6 Claims, 3 Drawing Sheets

CHOPPING TYPE COMPARATOR WITH CLOCKED INVERTER

BACKGROUND OF THE INVENTION

The present invention relates to a chopping type comparator driven by an inverter for comparing a pair of input signals with each other.

FIG. 3 is a circuit diagram showing a structure of a conventional chopping type comparator. In the figure, there are provided a pair of input terminals A and B receptive, respectively, of input signal voltages VA and VB to be compared with each other. The comparator is further provided with a control terminal C receptive of a control signal CONT. A pair of analog switches 1 and 2 are comprised of a field effect transistor of the metal-/oxide/semiconductor (MOS) structure. Respective one ends of the analog switches 1 and 2 are connected to the input terminals A and B, and respective other ends thereof are connected commonly to each other. The one analog switch 2 receives at its gate electrodes the control signal CONT, and the other analog switch 1 receives at its gate electrode an inverted one of the control signal CONT through an inverter 3. A capacitor 4 is connected at its one end to a common junction node of the analog switches 1 and 2. The other end of the capacitor 4 is connected to an input terminal of a complimentary MOS inverter or CMOS inverter 5. An analog switch 6 is connected between the input terminal and an output terminal OUT of the CMOS inverter 5, and is operated in response to the control signal CONT to switch between a conductive state and a nonconductive state.

In operation of the above described conventional comparator, the analog switches 2 and 6 are placed concurrently in the conductive state when the control signal CONT holds "1" level. Consequently, the input signal voltage VB is applied to the one end of the capacitor 4, and the CMOS inverter 5 is shorted between the input and output terminals thereof through the analog switch 6. In this operation, since the CMOS inverter 5 is composed of a pair of P channel transistor and N channel transistor having substantially the same driving ability, the CMOS inverter 5 has an input/output transfer characteristic terms of a varying input voltage VIN as shown in FIG. 4(a). As seen in the figure, as the input voltage VIN increases at the CMOS inverter 5, its output voltage VOUT is inverted from a high level to a low level when the input voltage VIN reaches a half level of a power supply voltage VDD. Therefore, the input voltage VIN and the output voltage VOUT are both held at VDD/2 because the CMOS inverter 5 is shorted between its input and output terminals through the conductive analog switch 6. Accordingly, when the control signal CONT is turned to "1" level, the capacitor 4 is charged to build up a voltage of VDD/2 − VB at the one end thereof through the conductive analog switch 2.

Next, when the control signal CONT is turned to "0" level, the analog switches 2 and 6 are concurrently turned off while the analog switch 1 is placed in the conductive state so that the other signal voltage VA is applied to the one end of the capacitor 4. Consequently, the CMOS inverter 5 receives an input voltage VIN in the level of VDD/2 − VB + VA which is a sum of the precedingly charged voltage VDD/2 − VB and the succeedingly applied voltage VA. In cases of VA > VB, VIN > VDD/2 is held so that the output voltage VOUT of the CMOS inverter 5 is turned to a low level. On the other hand, in case of VA < VB, VIN < VDD/2 is held so that the output voltage VOUT of the CMOS inverter 5 is turned to a high level. By such operation, the CMOS inverter 5 produces the output voltage VOUT indicative of a comparison result between the pair of signal voltages VA and VB.

In the conventional chopping type comparator, as shown in FIG. 5, the input voltage VIN of the CMOS inverter 5 is held at the intermediate level of VDD/2 while the control signal CONT is turned to "1" level. As shown in FIG. 4(b), the CMOS inverter consumes a great amount of driving current I in case that the input voltage VIN is held around VDD/2. The considerable driving current I flows through the CMOS inverter 5 throughout a period during which the control signal CONT is held at "1" level as shown in FIGS. 5(a) and 5(c). Thus, the conventional chopping type comparator suffers from a wasteful power consumption.

SUMMARY OF THE INVENTION

In view of the above noted drawback of the prior art, an object of the present invention is to significantly save the power consumption in the chopping type comparator. According to the invention, the chopping type comparator is comprised of a pair of first and second analog switches switchable alternately with each other between a conductive state and a nonconductive state. The first and second analog switches have respective one ends receptive separately of two input signals to be compared with one another, and respective other ends connected together to form a common junction node. A capacitor is connected at its one end to the common junction node. A clocked inverter is connected at its input terminal to another end of the capacitor, and is changeable between an active state and an inactive state. The clocked inverter is operated to change selectively into the inactive state when one of the first and second analog switches is turned to the conductive state. A third analog switch is coupled between the input and output terminals of the clocked inverter. The third analog switch is switched to a conductive state when said one of the first and second analog switches is placed in the conductive state.

In more general term, the inventive chopping type comparator is comprised of first input means receptive of a first input signal and second input means receptive of a second input signal. Control means is provided to apply a control signal effective to enable alternately the first and second input means. Storage means is connected to both of the first and second input means for storing a third signal produced according to the first and second input signals. A clocked inverter responsive to the control signal is connected at its input terminal to the storage means. Switch means is coupled between the input and output terminals of the clocked inverter to operate in response to the control signal in order to control the clocked inverter to receive at its input terminal the third signal, thereby producing at its output terminal a comparison result between the first and second input signals based on the received third signal.

In the above defined construction, when one of the first and second analog switches and the third analog switch are concurrently placed in the conductive state, the capacitor is charged to build up a certain voltage according to corresponding one of the two input signals to be compared. While the capacitor is charged, the clocked inverter is changed to the inactive state or floating state. Then, said one analog switch is switched to the nonconductive state while the other analog switch is alternately turned to the conductive state. Further, the third analog switch is switched to the nonconductive state and the clocked inverter is simultaneously returned to the active state. Consequently, the remaining input signal voltage is applied to the capacitor through the other analog switch turned to the conductive state, so that the sum of the precedingly charged or stored signal voltage and the succeedingly applied signal voltage is instantly fed to the clocked inverter, thereby producing an output signal voltage representative of the comparison result between the two input signal voltages.

DETAILED DESCRIPTION OF THE INVENTION

Figure 1:
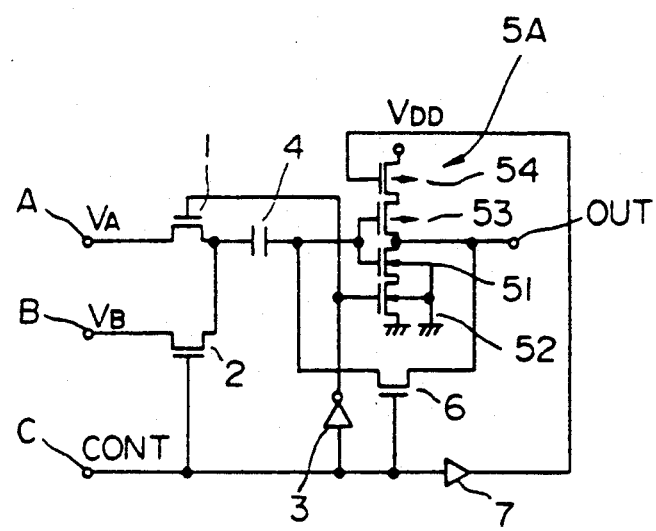
FIG. 1 is a circuit diagram showing an embodiment of the chopping type comparator according to the invention.

Hereinafter, one embodiment of the invention will be described in conjunction with the drawings. FIG. 1 is a circuit diagram showing a structure of the inventive chopping type comparator. In this figure, the same component is denoted by the same reference numeral as in the before-mentioned FIG. 3 structure in order to facilitate better understanding of the FIG. 1 structure. In place of the CMOS inverter 5 of the prior art, the disclosed chopping type comparator is provided with a clocked inverter 5A comprised of N channel transistors 51, 52 and P channel transistors 53, 54, connected in series between a power supply line and a ground line. Further, a buffer 7 of a non-inverting type is added to transmit a control signal CONT to a gate electrode of the P channel transistor 54. In the clocked inverter 5A, the inner pair of N channel transistor 51 and P channel transistor 53 have respective drain electrodes connected together to an output terminal OUT to constitute a CMOS inverter. Their respective gate electrodes are connected to storage means in the form of a capacitor 4. The outer N channel transistor 52 is connected at its gate electrode to control means in the form of an inverter 3 so as to receive an inverted one of the control signal CONT. The outer P channel transistor 54 receives at its gate electrode a non-inverted one of the control signal CONT through the buffer 7. Further, in manner similar to the conventional structure of FIG. 3, first input means in the form of a first analog switch 1 is connected between one input terminal A and the capacitor 4. Second input means in the form of a second analog switch 2 is connected between another input terminal B and the capacitor 4. Switch means in the form of a third analog switch 6 is coupled across the input and output terminals of the clocked inverter 5A.

Figure 2:
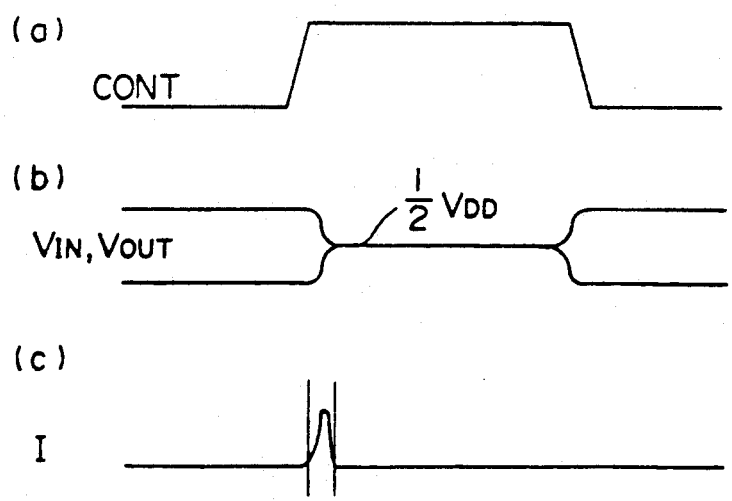
FIG. 2 is a timing chart showing operation of the inventive chopping type comparator shown in FIG. 1.

Next, the description is given for operation of the above disclosed chopping type comparator in conjunction with a timing chart of FIG. 2. Initially, the control signal CONT stays at "0" level so that the inverter 3 transmits "1" level of the control signal and the buffer 7 transmits "0" level of the control signal. Accordingly, the outer pair of N channel transistor 52 and P channel transistor 54 are turned on so that the clocked inverter 5A is placed in the active state. Then, the control signal CONT rises from "0" level to "1" level so that the second analog switch 2 and the third analog switch 6 are concurrently switched to the conductive state. At a transient interval of the control signal CONT from "0" level to "1" level, the clocked inverter 5A remains in the active state just before changing to the inactive state. At this moment, the clocked inverter 5A is instantly shorted through the conductive third analog switch 6 between the input and output terminals so that the input voltage VIN of the clocked inverter 5A is latched to VDD/2. Consequently, the capacitor 4 is charged immediately to build up a certain voltage VDD/2−VS through the conductive second analog switch 2. As shown in FIG. 2(c), at this transient interval, a driving current I flows momentarily through the clocked inverter 5A. Immediately thereafter, this level shift of the control signal CONT passes the inverter 3 and the buffer 7 to switch their logic levels to "0" and "1", respectively. consequently, the outer pair of N channel transistor 52 and P channel transistor 54 are turned to the nonconductive state to change the clocked inverter 5A to the inactive state or floating state. Since the output terminal of the clocked inverter 5A is held high impedance in the inactive state, the capacitor 4 has no discharge path although the third analog switch 6 is made conductive, thereby keeping the charged voltage VDD/2−VB. During this period, the clocked inverter 5 is held in the inactive state to thereby consume substantially no electric current. Then, the control signal CONT falls from "1" level to "0" level so that the second analog switch 2 and the third analog switch 6 are turned nonconductive while the first analog switch 1 is alternately turned conductive. Immediately thereafter, the clocked inverter 5A is returned to the active state. Consequently, the clocked inverter 5A receives at its input terminal a certain voltage which is a sum of the succeeding signal voltage VA and the preceding stored voltage VDD/2−VB, thereby producing an output signal indicative of the comparison result between the input signal voltages VA and VB.

As described above, according to the invention, the chopping type comparator is provided with the first and second analog switches alternately switchable between the conductive state and the nonconductive state. These analog switches have respective one ends receptive separately of the two input signals to be compared to one another, and respective other ends connected together at the common node. The capacitor is connected at its one end to the common node of the analog switches. The clocked inverter is connected at its input terminal to the outer end of the capacitor. The clocked inverter is switched to the inactive state when one of the first and second analog switches is selectively switched to the conductive state. The third analog switch is coupled between the output and input terminals of the clocked inverter. The third analog switch is turned to the conductive state when said one of the first and second analog switches is turned on. Then, the third analog switch is turned to the nonconductive state when the other of the first and second analog switches is turned on. By such construction, the driving current flows through the clocked inverter only momentarily at transient intervals during which each of the analog switches changes between the conductive state and the nonconductive state, thereby advantageously saving the power consumption.

Figure 6:
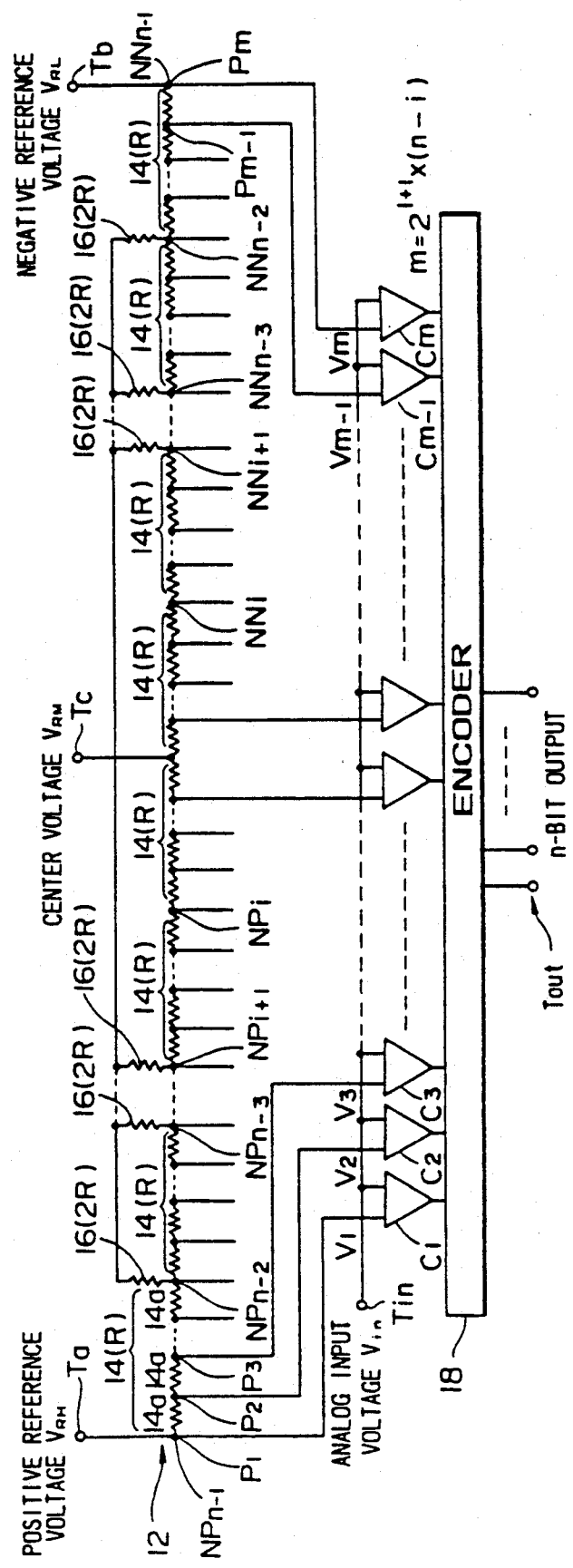
FIG. 6 is a circuit diagram showing an analog-to-digital converter utilizing the inventive chopping type comparator.

Lastly, FIG. 6 shows an analog-to-digital converter ADC which utilizes the inventive chopping type comparator. In FIG. 6, numeral 12 designates a reference-voltage-generating circuit which is made up of an R−2R resistor ladder network. The R−2R resistor ladder network consists of a combination of R−Ω resistors 14, and 2R−Ω resistors 16. There are (n−i) resistors 14 which are connected serially across positive reference voltage $V_{RN}$ and center voltage $V_{RM}$, and other (n−i) resistors 14 connected across negative reference voltage $V_{RL}$ and center voltage $V_{RM}$, where n is the number of bits of ADC, and i is an integer appropriately selected. Each connecting point of resistors 14 (called an exponential node hereafter) which is positive is designated by NPi, NPi+1, ..., NPn−2, NPn−1 (=$V_{RM}$), and each exponential node which is negative is denoted as NNi, NNi+1, ..., NNn−2, NNn−1 (=$V_{RL}$). Each exponential node NPi+1 to NPn−2 and NNi+1 to NNn−2 is connected to center terminal Tc through 2R−Ω resistor 16.

The R−2R resistor ladder network 12 thus configured generates individual reference voltages according to an exponential scale (these individual reference voltages are called exponential reference voltages hereafter): exponential reference voltage $V_{RH}$ is produced from exponential node NPn−1; exponential reference voltage $V_{RH}/2$ is produced from exponential node NPn−2; exponential reference voltage $V_{RH}/2^2$, $V_{RH}/2^{(n-i-2)}$, from node NPi+1; exponential reference voltage $V_{RH}/2^{(n-i-1)}$, from node NPi. In a similar manner, each negative exponential reference voltage $V_{RL}$, $V_{RL}/2$, $V_{RL}/2^2$, ..., $V_{RL}/2^{(n-i-2)}$, and $V_{RL}/2^{(n-i-1)}$ is produced from each exponential node NNn−1, NNn−2, NNn−3, ..., NNi+1, and NNi.

Each resistor 14 placed between two consecutive exponential nodes consists of $2^i$ resistors 14a of equal value. As a result, between two consecutive exponential nodes, there are provided $2^i$ individual nodes (including one of the two exponential nodes) at an equal interval. Thus, m (=$2^{i+1} \times (n-i)$) individual nodes P1, P2, P3, ..., Pm−1, Pm, including exponential nodes, are formed between terminals Ta and Tb, generating individual reference voltages V1 to Vm. Each individual reference voltage Vj (j=1 to m) is applied to one input terminal of comparator Cj, and is compared with analog input voltage $V_{in}$ simultaneously applied to the other input terminal thereof via input terminal $T_{in}$. Each comparator Cj is of the chopping type as shown in FIG. 1. These comparisons are performed simultaneously by all the comparators C1 to Cm, and the results of the comparisons are applied to encoder 18. Encoder 18 converts the m-bit input data into a n-bit binary code. Thus, analog input voltage $V_{in}$ supplied via input terminal $T_{in}$, is converted into n-bit digital data, and produced from n-bit output terminal $T_{out}$. A more specific case will now be described using an example of 9-bit ADC (n=9). When integer i is specified as i=4, the number of positive exponential nodes NPi to NPn−1 is 5 (=n−i), which is the same number a that of the negative exponential nodes NNi to NNn−1. Additionally, between two consecutive exponential nodes, there are 16 (=$2^i$) nodes, and so the total number of nodes is 160 (=16×10).

In this case, positive exponential reference voltages are $V_{RH}$, $V_{RH}/2$, $V_{RH}/4$, $V_{RH}/8$, $V_{RH}/16$; and negative exponential reference voltages are $V_{RL}$, $V_{RL}/2$, $V_{RL}/4$, $V_{RL}/8$, $V_{RL}/16$. Furthermore, each voltage across each resistor 14, i.e., each voltage between two consecutive exponential reference voltages (for example, a voltage between $V_{RH}$ and $V_{RH}/2$, or between $V_{RH}/2$ and $V_{RH}/4$, etc.) is divided into 16 equal parts, producing 160 individual reference voltages.

In a similar manner, when n=9 bits and i=5, the number of exponential nodes is 8 (=2×(n−i)), and the number of nodes between two consecutive exponential nodes is 32(=$2^i$), and so the total number m of comparators is 256 (=9×32). Moreover, when n=9 and i=6, the total number of comparators is 384 (=6×64).

Figure 3:
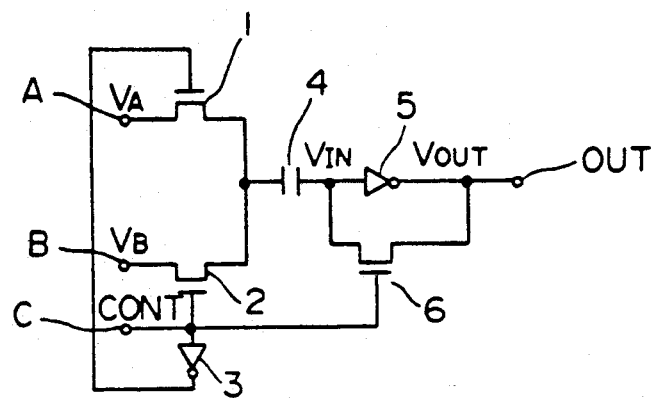
FIG. 3 is a circuit diagram showing a construction of a conventional chopping type comparator.
Figure 4:
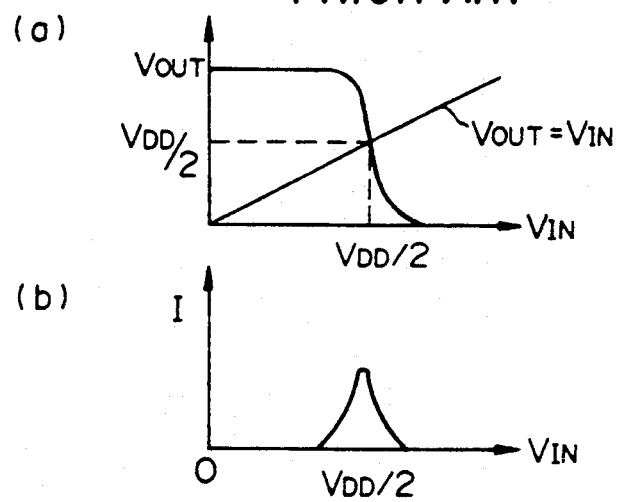
FIG. 4 is graphs showing input/output transfer characteristic and driving current characteristic of a CMOS inverter provided in the conventional comparator.
Figure 5:
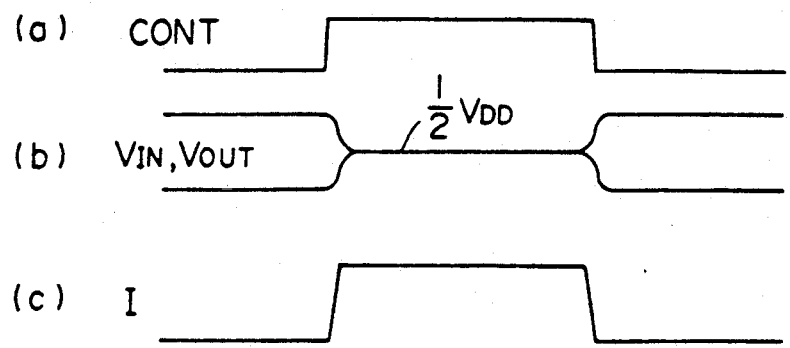
FIG. 5 is a timing chart showing operation of the conventional comparator.

As described above, the FIG. 6 ADC utilises the inventive chopping type comparator shown in FIG. 1, which is effective to save its own driving current to thereby reduce power consumption by 1/10 as compared to the conventional chopping type comparator shown in FIG. 3.

What is claimed is:

1. A chopping type comparator comprising:
   a pair of first and second analog switches switchable alternatively with each other between a conductive state and a nonconductive state by a control signal, the first and second analog switches having respective one ends receptive of two input signals to be compared with one another, and respective other ends connected together to form a common junction node;
   a capacitor having one end coupled to the common junction node of the first and second analog switches;
   a clocked inverter having at least four FETs and being changeable between an active state and an inactive state by the control signal, one of the FETs being switchable between a conductive state and a nonconductive state by the control signal and a second of the FETS concurrently switching with said one of the FETS between the conductive state and the nonconductive state by the control signal, the clocked inverter having an output terminal and an input terminal connected to another end of the capacitor, the clocked inverter being in the active state when one of the first and second analog switches is switched to the conductive state and being in the inactive state when the other of the first and second switches is in the conductive state; and
   a third analog switch coupled between the input and output terminals of the clocked inverter and being switchable to a conductive state by the control signal when said one of the first and second analog switches is placed in the conductive state, such that during the inactive state of the clocked inverter a current flow through the clocked inverter is substantially eliminated.

2. A chopping type comparator comprising:
   first input means receptive of a first input signal;
   second input means receptive of a second input signal;

control means operative to apply a control signal effective to alternately enable the first and second input means;

storage means for storing a third signal produced according to the first and second input signals;

a clocked inverter having at least four FETs and being changeable between an active state and an inactive state by the control signal, one of the FETS being switchable between a conductive state and a nonconductive state by the control signal and a second of the FETS concurrently switching with said one of the FETS between the conductive state and the nonconductive state by the control signal, the clocked inverter having an output terminal and an input terminal connected to the storage means, the clocked inverter being in the active state when one of the first and second input means is enabled and being in the inactive state when the other of the first and second input means is enabled; and switch means coupled between the input and output terminals of the clocked inverter so as to receive at its output terminal the third signal and so as to produce at its output terminal a comparison result between the first and second input signals based on the received third signal, such that during the inactive state of the clocked inverter a current flow through the clocked inverter is substantially eliminated.

3. A chopping type comparator according to claim 2; wherein the control means includes a second inverter operative in response to the control signal to change the clocked inverter between an active state and an inactive state.

4. A chopping type comparator according to claim 3; wherein the clocked inverter includes a pair of transistor switches responsive to an output from the second inverter for suppressing a driving current flowing through the clocked inverter in the active state.

5. A chopping type comparator circuit comprising:

a first input switch switchable between a conductive state and a nonconductive state by a control signal;

a second input switch switchable between a conductive state and a nonconductive state by a first inverter controlled by the control signal, the second switch being alternatively switched with the first switch from the conductive state to the nonconductive state, the first and second switches having respective one ends receptive of two input signals to be compared with each other, and respective other ends coupled to form a common junction node;

a capacitor having one end coupled to the common junction node of the first and second switches;

a clocked inverter having at least four FETS and being changeable between an active state and an inactive state by the control signal, one of the FETS being switchable between a conductive state and a nonconductive state by the control signal and a second of the FETS concurrently switching with said one of the FETS between the conductive state and the nonconductive state by the control signal, the clocked inverter having an output terminal and an input terminal coupled to another end of the capacitor, the clocked inverter being in the active state when one of the first and second switches is switched to the conductive state and being in the inactive state when the other of the first and second switches is in the conductive state; and a third switch coupled between the input and output terminals of the clocked inverter and being switchable to a conductive state by the control signal when the one of the first and second switches is switched to the conductive state, such that during the inactive state of the clocked inverter a current flow through the clocked inverter is substantially eliminated.

6. An Analog to Digital converting circuit, comprising:

a plurality of chopping type comparator circuits;

wherein each of the plurality of chopping type comparator circuits include:

a first input switch switchable between a conductive state and a nonconductive state by a control signal;

a second input switch switchable between a conductive state and a nonconductive state by a first inverter controlled by the control signal, the second switch being alternatively switched with the first switch from the conductive state to the nonconductive state, the first and second switches having respective one ends receptive of two input signals to be compared with each other, and respective other ends coupled to form a common junction node;

a capacitor having one end coupled to the common junction node of the first and second switches;

a clocked inverter having at least four FETS and being changeable between an active state and an inactive state by the control signal, one of the FETS being switchable between a conductive state and a nonconductive state by the control signal and a second of the FETS concurrently switching with said one of the FETS between the conductive state and the nonconductive state by the control signal, the clocked inverter having an output terminal and an input terminal coupled to another end of the capacitor, the clocked inverter being in the active state when one of the first and second switches is switched to the conductive state and being in the inactive state when the other of the first and second switches is in the conductive state; and a third switch coupled between the input and output terminals of the clocked inverter and being switchable to a conductive state by the control signal when the one of the first and second switches is switched to the conductive state.

* * * * *